United States Patent
Chiang et al.

(10) Patent No.: US 10,908,194 B1
(45) Date of Patent: Feb. 2, 2021

(54) LOAD IDENTIFICATION SYSTEM

(71) Applicant: Chicony Power Technology Co., Ltd., New Taipei (TW)

(72) Inventors: Chih-Hsien Chiang, New Taipei (TW); Hung-Ta Shih, New Taipei (TW)

(73) Assignee: CHICONY POWER TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 16/842,715

(22) Filed: Apr. 7, 2020

(30) Foreign Application Priority Data

Feb. 7, 2020 (TW) .............................. 109103914 A

(51) Int. Cl.
| | |
|---|---|
| *G01R 19/25* | (2006.01) |
| *G01R 19/175* | (2006.01) |
| *G01R 25/00* | (2006.01) |
| *H02M 1/08* | (2006.01) |
| *H03K 17/13* | (2006.01) |
| *H02M 5/257* | (2006.01) |
| *G01R 19/165* | (2006.01) |

(52) U.S. Cl.
CPC ..... *G01R 19/175* (2013.01); *G01R 19/16538* (2013.01); *G01R 25/005* (2013.01); *H02M 5/2573* (2013.01); *H03K 17/13* (2013.01)

(58) Field of Classification Search
None
See application file for complete search history.

(56) References Cited

U.S. PATENT DOCUMENTS

| | | | |
|---|---|---|---|
| 8,941,308 B2 | 1/2015 | Briggs et al. | |
| 9,130,373 B2 * | 9/2015 | Testani | H05B 39/04 |
| 9,142,962 B2 * | 9/2015 | Russell | G01R 21/006 |
| 9,279,835 B2 * | 3/2016 | Russell | G01R 19/2506 |
| 9,407,094 B2 * | 8/2016 | Russell | H02J 3/01 |
| 9,655,219 B2 | 5/2017 | Chen | |
| 10,080,273 B1 * | 9/2018 | Slivka | H02M 5/293 |
| 10,199,921 B2 | 2/2019 | Chung et al. | |
| 10,306,732 B2 | 5/2019 | Gotou et al. | |
| 2015/0282263 A1 | 10/2015 | Ueda et al. | |

FOREIGN PATENT DOCUMENTS

| | | |
|---|---|---|
| CN | 204904053 U | 12/2015 |
| CN | 105301382 A | 2/2016 |
| TW | I275226 B | 3/2007 |
| TW | 201011517 A1 | 3/2010 |

* cited by examiner

*Primary Examiner* — Kenneth B Wells
(74) *Attorney, Agent, or Firm* — CKC & Partners Co., LLC

(57) ABSTRACT

A load identification system includes an AC-power input unit, a load, a zero-crossing detector, a microcontroller, a first and a second current phase detectors. The zero-crossing detector is configured to output a zero-voltage pulse signal when a zero-crossing signal of the AC-power input unit is detected. The first current phase detector detects a current flowing through the load to output a first voltage signal. When the current flows along a first direction, the first voltage signal is at a high level. The second current phase detector is configured to detect the current flowing through the load to output a second voltage signal. When the current flows along a second direction, the second voltage signal is at a high level. The microcontroller is configured to receive and identify the type of the load according to the zero-voltage pulse signal, the first and the second voltage signals.

15 Claims, 7 Drawing Sheets

LOAD IDENTIFICATION SYSTEM

RELATED APPLICATIONS

The application claims priority to Taiwan Application Serial Number 109103914, filed Feb. 7, 2020, which is herein incorporated by reference.

BACKGROUND

Technical Field

The disclosure relates to an identification system, and more particularly to a system for identifying a load as resistive, inductive or capacitive.

Description of Related Art

In general, the types of load are divided into resistive, inductive, and capacitive load. With the development of technology, more and more intelligent electronic products are required to automatically determine whether there is a connected load and the types of the load. Control or protection, such as: light dimming control, switch control or motor control, according to no load or different load types can improve the accuracy of application functions and avoid damage caused by installation errors.

Therefore, how to identify the types of the load is one of the important issues in this field.

SUMMARY

One aspect of the present disclosure is a load identification system. The load identification system includes an AC power input component, a load, a zero-crossing detection circuit, a control circuit, and first and second current phase detection circuits. The load is coupled to the AC power input component. The zero-crossing detection circuit is coupled to the AC power input component and configured to output a zero-voltage pulse signal when a zero-crossing signal of the AC power input component is detected. The first current phase detection circuit is coupled to the AC power input component and configured to detect a current flowing through the load to output a first voltage signal. When the current flows along a first direction, the first voltage signal is at a high level. The second current phase detection circuit is coupled to the AC power input component and configured to detect the current flowing through the load to output a second voltage signal. When the current flows along a second direction, the second voltage signal is at a high level. The control circuit is configured to receive the zero-voltage pulse signal, the first voltage signal and the second voltage signal and to identify a type of the load according to the zero-voltage pulse signal, the first voltage signal and the second voltage signal.

In this way, the zero-voltage pulse signal output by the zero-crossing detection circuit can obtain the time when the AC input signal output by the AC power input component passes through the zero potential. Through the voltage signals output by the current phase detection circuit, the direction of the current flowing through the load can be determined. And by comparing the time of zero-voltage pulse signal with peak value, and the transition time of voltage signals, the connected load can be identified as resistive, inductive or capacitive according to whether the latter is synchronous, behind or leading compared to the former.

DETAILED DESCRIPTION

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present disclosure. Furthermore, for simplifying the diagrams, some of the conventional structures and elements are shown with schematic illustrations.

The terms used in this specification and claims, unless otherwise stated, generally have their ordinary meanings in the art, within the context of the disclosure, and in the specific context where each term is used. Certain terms that are used to describe the disclosure are discussed below, or elsewhere in the specification, to provide additional guidance to the practitioner skilled in the art regarding the description of the disclosure.

In the description herein and throughout the claims that follow, the terms "comprise" or "comprising," "include" or "including," "have" or "having," "contain" or "containing" and the like used herein are to be understood to be open-ended, i.e., to mean including but not limited to. In addition, in the description herein and throughout the claims that follow, the phrase "and/or" includes any and all combinations of one or more of the associated listed claims.

In this document, the term "coupled" may also be termed "electrically coupled," and the term "connected" may be termed "electrically connected." "Coupled" and "connected" may also be used to indicate that two or more elements cooperate or interact with each other.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments.

Figure 1:
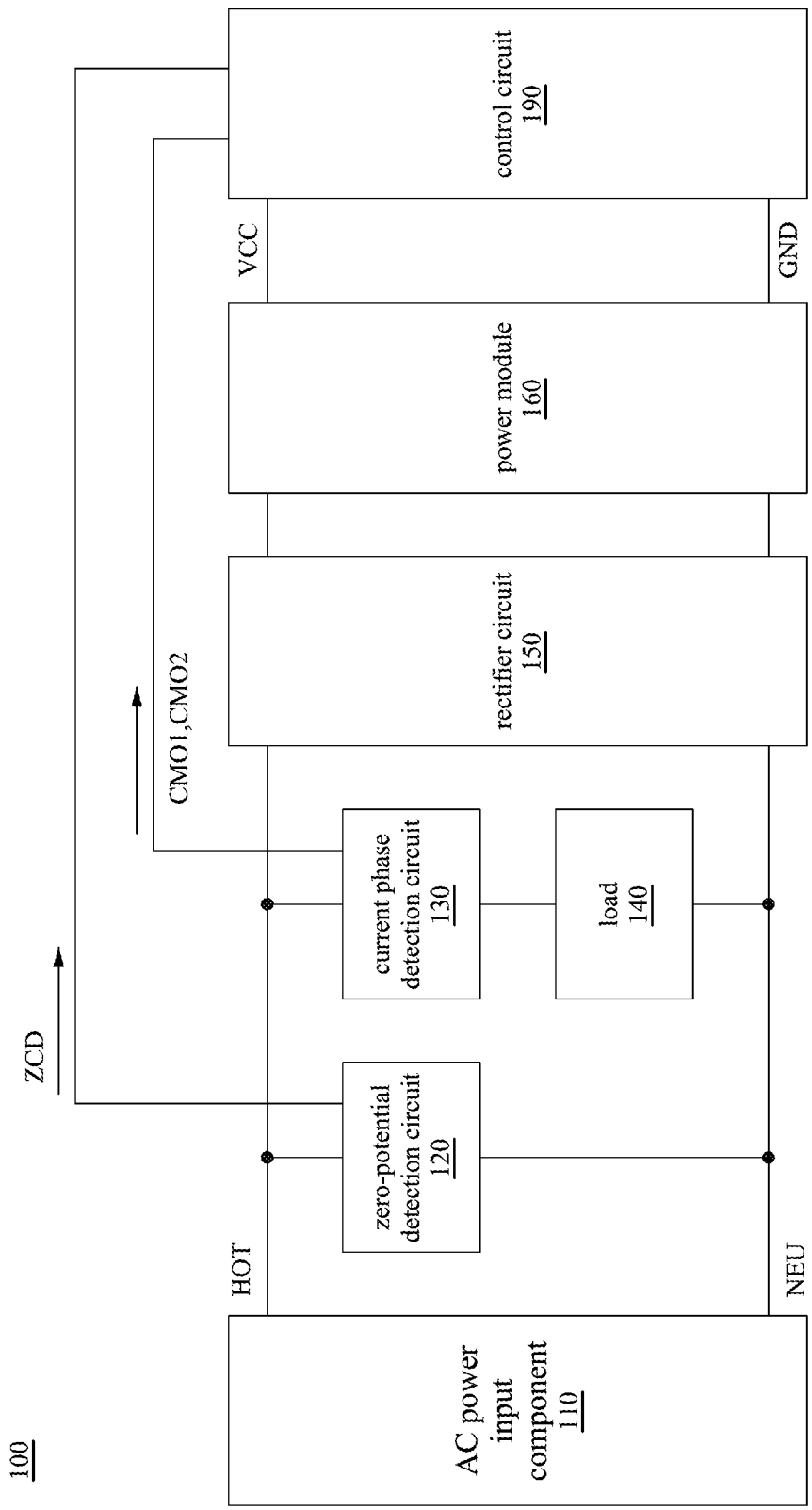
FIG. 1 is a schematic diagram illustrating a load identification system in accordance with some embodiments of the disclosure.

Please refer to FIG. 1. FIG. 1 is a schematic diagram illustrating a load identification system 100 in accordance with some embodiments of the disclosure. As shown in FIG. 1, the load identification system 100 includes an AC power input component 110, a zero-crossing detection circuit 120, a current phase detection circuit 130, a load 140, and a control circuit 190. In some embodiments, the load identification system 100 further includes a rectifier circuit 150 and a power module 160.

In structure, the AC power input component 110 is coupled to the zero-crossing detection circuit 120, the current phase detection circuit 130, the load 140 and the rectifier circuit 150. The rectifier circuit 150 is coupled to the power module 160. The power module 160 is coupled to the control circuit 190. Specifically, the AC power input component 110 is connected to the rectifier circuit 150 through a live wire HOT and a neutral wire NEU. The zero-crossing detection circuit 120 is connected between the live wire HOT and the neutral wire NEU. The current phase detection circuit 130 is connected between the live wire HOT and the load 140. The load 140 is connected between the current phase detection circuit 130 and the neutral wire NEU.

Operationally, the AC power input component 110 is configured to provide an AC input signal. The zero-crossing detection circuit 120 is configured to output a zero-voltage pulse signal ZCD when the AC input signal of the AC power input component 110 is detected as a zero-crossing signal. The current phase detection circuit 130 is configured to detect the current flowing through the load 140 so as to output voltage signals CMO1 and CMO2. The control circuit 190 is configured to receive the zero-voltage pulse signal ZCD, the voltage signals CMO1 and CMO2 and to identify a type of the load 140 as a resistive load, an inductive load or a capacitive load according to the zero-voltage pulse signal ZCD, and the voltage signals CMO1 and CMO2.

In addition, the rectifier circuit 150 is configured to receive the AC input signal so as to rectify into a DC signal, and to send the DC signal to the power module 160. The power module 160 is configured to perform DC voltage conversion according to the DC signal so as to provide a system high voltage VCC and a system low voltage GND required by control circuit 190.

In some embodiments, the rectifier circuit 150 may be realized by a full-wave rectifier, a half-wave rectifier, a full-bridge rectifier, a half-bridge rectifier, or a voltage doubler. In some embodiments, the power module 160 may be realized by various DC-DC converters. For example, an isolated converter or a non-isolated converter, such as a buck converter, a buck-boost converter. In some embodiments, the control circuit 190 may be realized by a central processing unit (CPU), a microcontroller unit (MCU), a complex programmable logic device (CPLD), or a field-programmable gate array (FPGA), etc.

Figure 2:
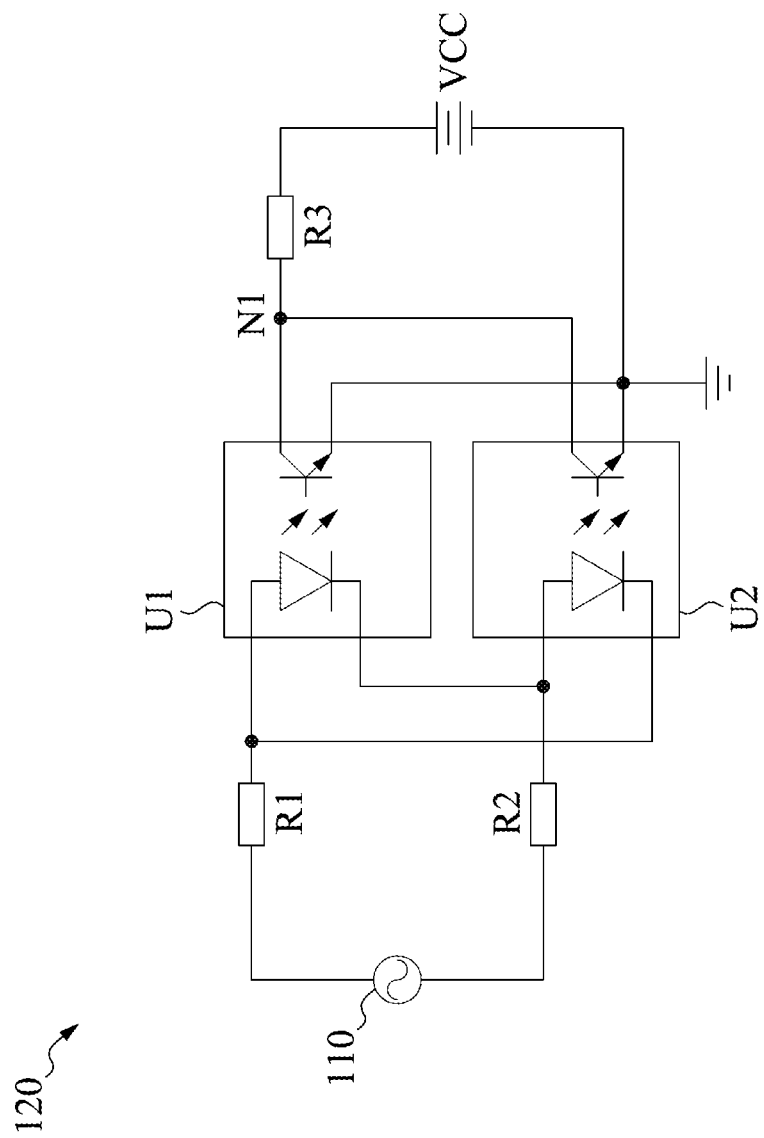
FIG. 2 is a schematic diagram illustrating a zero-crossing detection circuit in accordance with some embodiments of the disclosure.

Please refer to FIG. 2. FIG. 2 is a schematic diagram illustrating a zero-crossing detection circuit 120 in accordance with some embodiments of the disclosure. As shown in FIG. 2, the zero-crossing detection circuit 120 includes resistances R1, R2, R3, and optical couplers U1 and U2. A first terminal of the resistance R1 is connected to the AC power input component 110, a second terminal of the resistance R1 is connected to a first input terminal of the optical coupler U1 and a second input terminal of the optical coupler U2. A first terminal of the resistance R2 is connected to the AC power input component 110, and a second terminal of the resistance R2 is connected to a first input terminal of the optical coupler U2 and a second input terminal of the optical coupler U1. The first output terminal of the optical coupler U1, the first input terminal of the optical coupler U2 and a first terminal of the resistance R3 are connected at a node N1. A second terminal of the resistance R3 is connected to the system high voltage VCC. The second output terminal of the optical coupler U1 and the second input terminal of the optical coupler U2 are connected to the system low voltage GND.

Operationally, when the AC input signal output by the AC power input component 110 is at a positive half cycle, the optical coupler U1 turns on and the optical coupler U2 turns off. The system high voltage VCC passes from the resistance R3 through the optical coupler U1 to the ground; therefore, the voltage level of the node N1 is at the system low voltage GND. When the AC input signal output by the AC power input component 110 is at a negative half cycle, the optical coupler U2 turns on and the optical coupler U1 turns off. The system high voltage VCC passes from the resistance R3 through the optical coupler U2 to the ground; therefore, the voltage level of the node N1 is also at the system low voltage GND.

And when the AC input signal output by the AC power input component 110 is between the positive half cycle and the negative half cycle and is close to a zero potential, since the optical couplers U1 and U2 both turn off and form a broken circuit, the voltage level of the node N1 is the system high voltage VCC.

In this way, with the zero-crossing detection circuit 120, a high-level pulse signal is able to be output from the node N1 every time the AC input signal output by the AC power input component 110 passes through the zero potential. In other words, when the zero-crossing detection circuit 120 detects that the AC power input component 110 outputs a zero-crossing signal, the high-level pulse signal output from the node N1 is taken as the zero-voltage pulse signal.

It should be noted that, in some other embodiments, the zero-crossing detection circuit 120 may include only one bidirectional optical coupler. With a set of light-emitting elements arranged opposite to each other inside the bidirectional optical coupler, the bidirectional optical coupler is able to be turned on when the AC input signal is at the positive half cycle or the negative half cycle.

Figure 3:
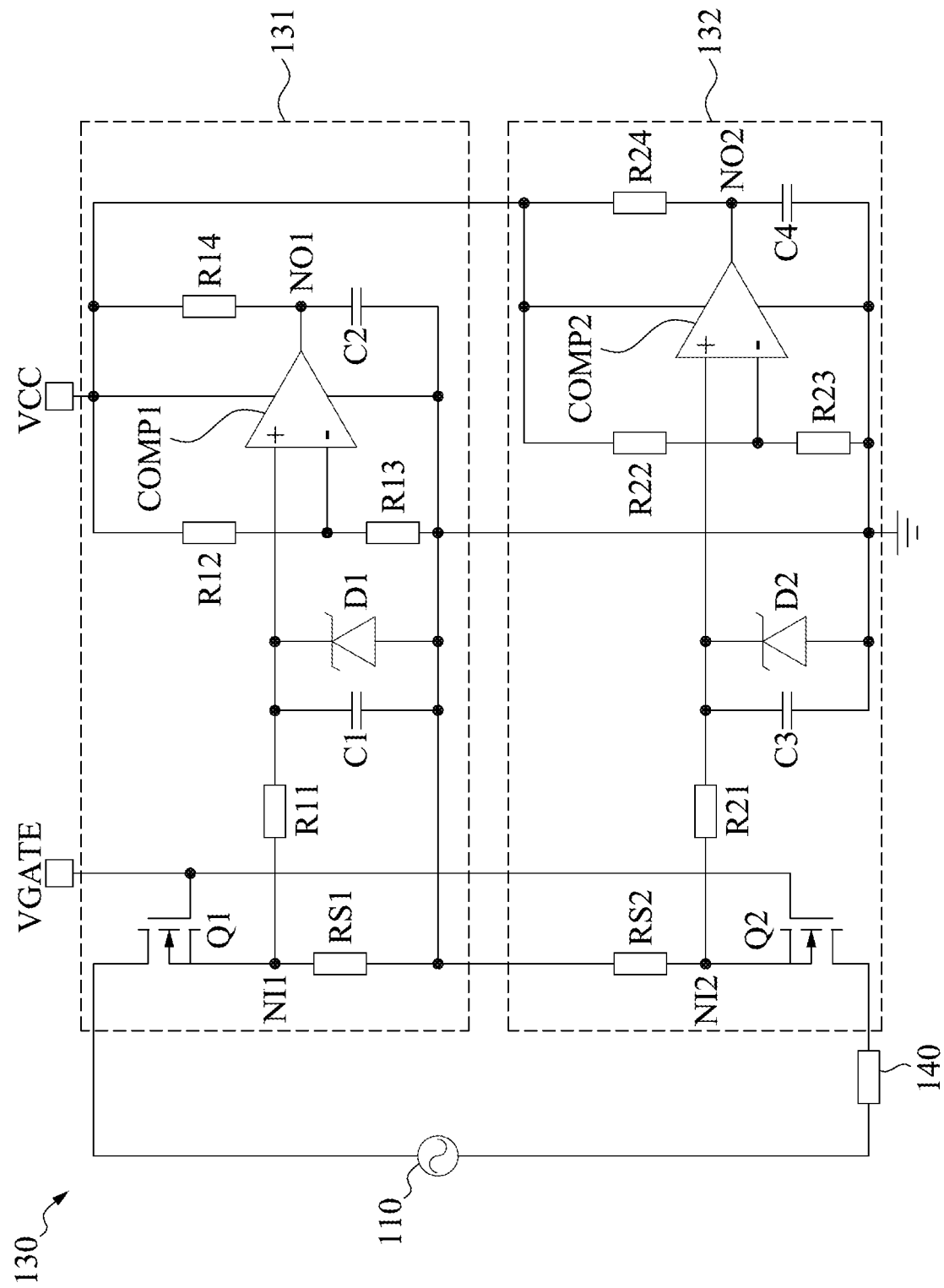
FIG. 3 is a schematic diagram illustrating a current phase detection circuit in accordance with some embodiments of the disclosure.

Please refer to FIG. 3. FIG. 3 is a schematic diagram illustrating a current phase detection circuit 130 in accordance with some embodiments of the disclosure. As shown in FIG. 3, the current phase detection circuit 130 includes a first current phase detection circuit 131 and a second current phase detection circuit 132. The first current phase detection circuit 131 includes resistances RS1, R11, R12, R13 and R14, capacitances C1 and C2, a diode D1, a switch Q1, and a comparator COMP1. The second current phase detection circuit 132 includes resistances RS2, R21, R22, R23 and R24, capacitances C3 and C4, a diode D2, a switch Q2, and a comparator COMP2.

A first terminal of the switch Q1 is coupled to the AC power input component 110, and a second terminal of the switch Q1 is coupled to a first terminal of the resistance RS1 and a first terminal of the resistance R11 through a node NI1. A second terminal of the resistance R11 is coupled to a first terminal of the capacitance C1, a first terminal of the diode D1 and a first input terminal of the comparator COMP1. A second input terminal of the comparator COMP1 is coupled to a second terminal of the resistance R12 and a first terminal of the resistance R13. A first terminal of the resistance R12 and a first terminal of the resistance R14 are both coupled to the system high voltage VCC. A second terminal of the resistance R14 and a first terminal of the capacitance C2 are coupled to an output terminal of the comparator COMP1 through a node NO1. And a second terminal of the resistance RS1, a second terminal of capacitance C1, a second terminal of the diode D1, a second terminal of the resistance R13 and a second terminal of the capacitance C2 are connected to the ground.

The load 140 is coupled between the first terminal of the switch Q2 and the AC power input component 110. The second terminal of the switch Q1 is coupled to a second terminal of the resistance RS2 and a first terminal of the resistance R21 through a node N12. A second terminal of the resistance R21 is coupled to a first terminal of the capacitance C3, a first terminal of the diode D2 and a first input terminal of the comparator COMP2. A second input terminal of the comparator COMP2 is coupled to a second terminal of the resistance R22 and a first terminal of the resistance R23. A first terminal of the resistance R22 and a first terminal of the resistance R24 are both coupled to the system high voltage VCC. A second terminal of the resistance R24 and a first terminal of the capacitance C4 are coupled to an output terminal of the comparator COMP2 through a node NO2. A first terminal of the resistance RS2, a second terminal of the capacitance C3, a second terminal of the diode D2, a second terminal of the resistance R23 and a second terminal of the capacitance C4 are connected to the ground.

Operationally, control terminals of the switches Q1 and Q2 are both configured to receive a gate control signal VGATE. When the gate control signal VGATE is at the logic high level, the switches Q1 and Q2 turn on so that the current phase detection circuit 130 is able to detect whether there is a current flowing through the load 140, and the flowing direction of the current. Specifically, the first current phase detection circuit 131 is configured to detect the current flowing through the load 140 so as to output the voltage signal CMO1 from the node NO1. The second current phase detection circuit 132 is configured to detect the current flowing through the load 140 so as to output the voltage signal CMO2 from the node NO2.

Further, when the AC input signal output by the AC power input component 110 is at the positive half cycle, the current flows from the AC power input component 110 through the switch Q1, the resistance RS1, the resistance RS2, the switch Q2 and the load 140 in order (hereinafter referred to as the current flows along a first direction.) At the same time, the voltage level of the node NI1 is positive and the voltage level of the node NI2 is negative; therefore, after the comparators COMP1 and COMP2 compare the voltage levels of the nodes NI1 and NI2 and a reference voltage (i.e., the system low voltage GND), the comparator COMP1 outputs a high voltage from the node NO1, and the comparator COMP2 outputs a low voltage from the node NO2.

Similarly, when the AC input signal output by the AC power input component 110 is at the negative half cycle, the current flows from the AC power input component 110 through the load 140, the switch Q2, the resistance RS2, the resistance RS1 and the switch Q1 in order (hereinafter referred to as the current flows along a second direction.) At the same time, the voltage level of the node NI2 is positive and the voltage level of the node NI1 is negative, therefore, after the comparators COMP1 and COMP2 compare the voltage levels of the nodes NI1 and NI2 and the reference voltage (i.e., the system low voltage GND), the comparator COMP1 outputs the low voltage from the node N01, and the comparator COMP2 outputs the high voltage from the node NO2.

In other words, when the current flows along the first direction, the voltage signal CMO1 output by the first current phase detection circuit 131 is at the high level, and when the current flows along the second direction, the voltage signal CMO2 output by the second current phase detection circuit 132 is at the high level. In this way, with the current phase detection circuit 130, the direction of the current flowing through the load 140 is able to be determined according to the voltage signals CMO1 and CMO2 output by the current phase detection circuit 130.

Figure 4:
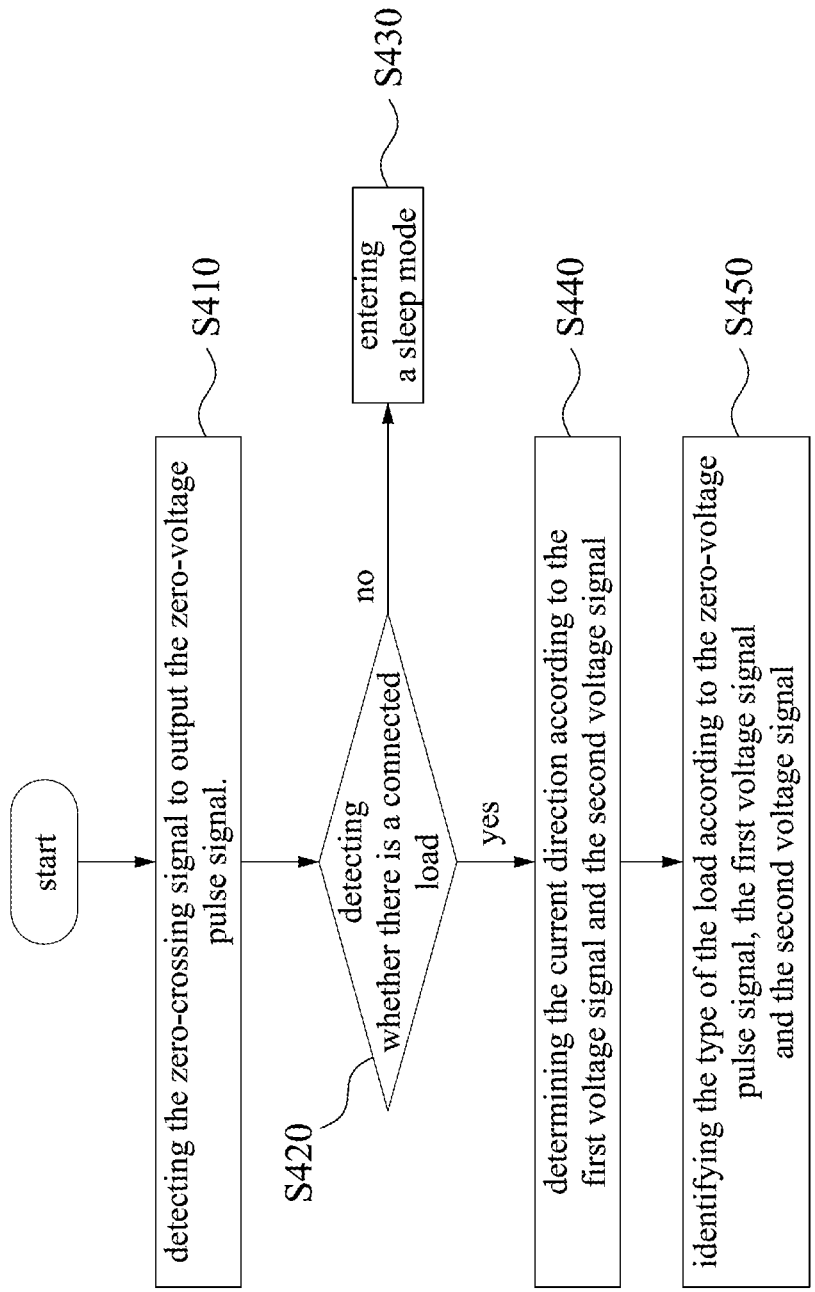
FIG. 4 is a flow chart illustrating a load identification method in accordance with some embodiments of the disclosure.

Please refer to FIG. 4. FIG. 4 is a flow chart illustrating a load identification method 400 in accordance with some embodiments of the disclosure. For the sake of convenience and clarity, the following load identification method 400 is described in accompanying with the embodiments shown in FIG. 1 to FIG. 7, but not limited thereto. Various alterations and modifications may be performed on the disclosure by those of ordinary skilled in the art without departing from the principle and spirit of the disclosure. As shown in FIG. 4, the load identification method 400 includes operations S410, S420, S430, S440 and S450.

Figure 5:
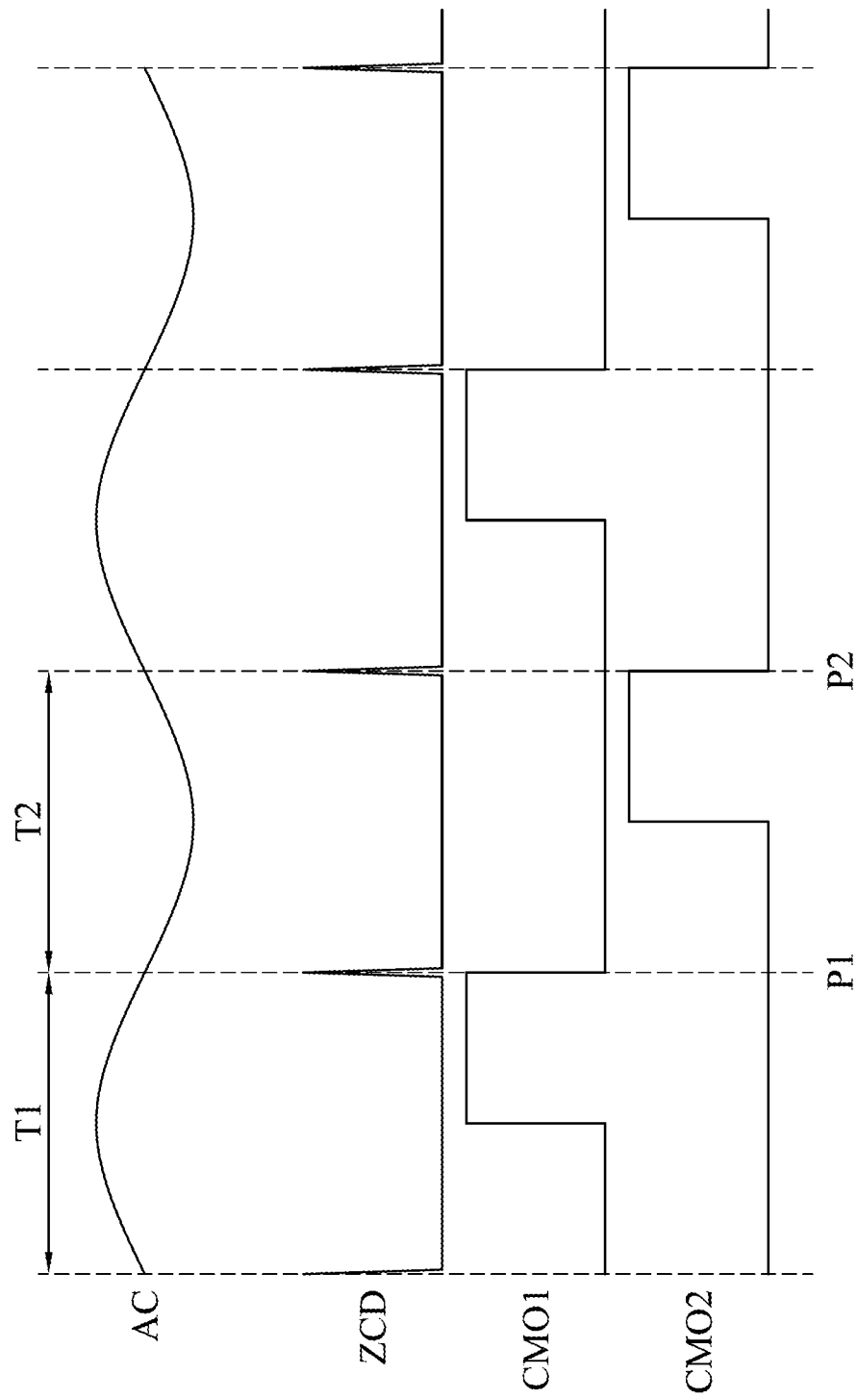
FIG. 5 is a schematic diagram illustrating detected signals of a resistive load in accordance with some embodiments of the disclosure.

Firstly, in operation S410, zero-crossing detection circuit 120 detects the zero-crossing signal. For example, as shown in FIG. 5, the AC input signal AC has a positive value in the period T1, and has a negative value in the period T2. Therefore, when the AC input signal AC as the zero-crossing signal turns from positive to negative at the time P1, the zero-crossing detection circuit 120 outputs the zero-voltage pulse signal ZCD with high level. For another example, when the AC input signal AC as zero-crossing signal turns from negative to positive at time P2, the zero-crossing detection circuit 120 outputs the zero-voltage pulse signal ZCD with high level again.

Next, in operation S420, the current phase detection circuit 130 detects whether there is a connected load 140. Specifically, when there is no load 140 connected (i.e., the first terminal of the switch Q2 shown in FIG. 3 is floating), the AC power input component 110 and the current phase detection circuit 130 will not form a loop. Because the voltage levels of the nodes NI1 and NI2 are both at the low voltage level due to disconnection, the voltage signals CMO1 and CMO2 output by the nodes NO1 and NO2 respectively are also at the low level.

In this way, when both the voltage signals CMO1 and CMO2 keep at the low level, it means that there is no load connected, and operation S430 is performed, entering a sleep mode. It should be noted that, those skill in art may adjust the operation S430 based on actual requirement, and not intended to limit the present disclosure.

When one of the voltage signals CMO1 and CMO2 is at the high level, it means that there is the connected load 140, and the operation S440 is performed. In operation S440, the current phase detection circuit 130 determines the current direction according to the voltage signals CMO1 and CMO2. Specifically, when the voltage signal CMO1 is at the high level, it means that the current flows along the first direction, and when the voltage signal CMO2 is at the high level, it means that the current flows along the second direction. The detailed content has been described in the previous paragraph, and will not be repeated here.

Next, in operation S450, the control circuit 190 identifies the type of the load 140 according to the zero-voltage pulse signal ZCD, the voltage signals CMO1 and CMO2. Specifically, the control circuit 190 determines the load 140 is a resistive, inductive or capacitive load according to the time of the zero-voltage pulse signal ZCD having the peak value, and the time of the voltage signal CMO1 or CMO2 turning from the high level into the low level.

Further, the voltage and the current flowing through the resistive load are in phase; therefore, if the time of the zero-voltage pulse signal ZCD having the peak value and the transition time of the voltage signal CMO1 or CMO2 are synchronize, the load 140 is identified as the resistive load. For example, please refer to FIG. 5, a schematic diagram illustrating a detected signal of the resistive load in accordance with some embodiments of the disclosure. As shown in FIG. 5, when the AC input signal AC is at the positive half cycle in the period T1, the current flows through the load 140 along the first direction. At the time P1, the AC input signal AC turns from positive to negative, the zero-voltage pulse signal ZCD has the peak value and the voltage signal CMO1 turns from the high level into the low level. When the AC input signal AC is at the negative half cycle in the period T2, the current flows through the load 140 along the second direction. At the time P2, the AC input signal AC turns from negative to positive, the zero-voltage pulse signal ZCD has the peak value and the voltage signal CMO2 turns from the high level into the low level.

Therefore, if the zero-voltage pulse signal ZCD has the peak value at a first time (e.g., the time P1) of the zero-voltage pulse signal ZCD turning from positive to negative, and if the voltage signal CMO1 turns from the high level into the low level at the first time, the control circuit 190 can identify the load 140 as the resistive load. Or if the zero-voltage pulse signal ZCD has the peak value at the second time (e.g., the time P2) of the zero-voltage pulse signal ZCD turning from negative to positive, and the voltage signal CMO2 turns from the high level into the low level at the second time, the control circuit 190 can identify the load 140 as the resistive load.

Figure 6:
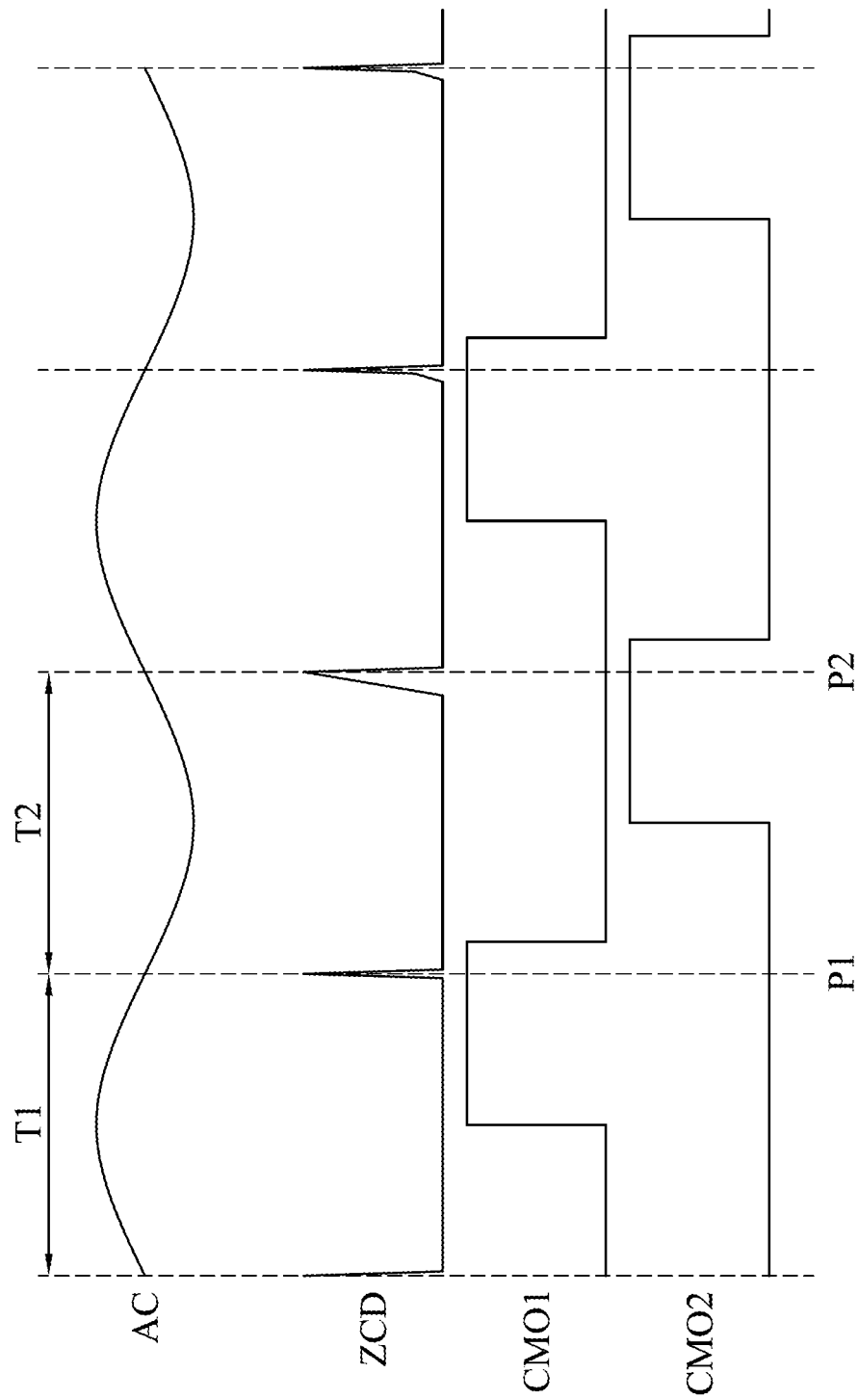
FIG. 6 is a schematic diagram illustrating detected signals of an inductive load in accordance with some embodiments of the disclosure.

On other hand, the current flowing through the inductive load will be 90 degrees behind the voltage; therefore, if the transition time of the voltage signal CMO1 or CMO2 is after the time of the zero-voltage pulse signal ZCD having the peak value, the load 140 is identified as the inductive load. For example, please refer to FIG. 6, a schematic diagram illustrating a detected signal of the inductive load in accordance with some embodiments of the disclosure. As shown in FIG. 6, when the AC input signal AC is at the positive half cycle in the period T1, the current flows through the load 140 along the first direction. At the time P1 of the AC input signal AC turning from positive to negative, the zero-voltage pulse signal ZCD has the peak value and after the time P1, the voltage signal CMO1 turns from the high level into the low level. When the AC input signal AC is at the negative half cycle in the period T2, the current flows through the load 140 along the second direction. At the time P2 of the AC input signal AC turning from negative to positive, the zero-voltage pulse signal ZCD has the peak value and after the time P2, the voltage signal CMO2 turns from the high level into the low level.

Therefore, if the zero-voltage pulse signal ZCD has the peak value at a first time (e.g., the time P1) of the zero-voltage pulse signal ZCD turning from positive to negative, and if the voltage signal CMO1 turns from the high level into the low level after the first time, the control circuit 190 can identify the load 140 as the inductive load. Or if the zero-voltage pulse signal ZCD has the peak value at the second time (e.g., the time P2) of the zero-voltage pulse signal ZCD turning from negative to positive, and if the voltage signal CMO2 turns from the high level into the low level after the second time, the control circuit 190 can identify the load 140 as the inductive load.

Figure 7:
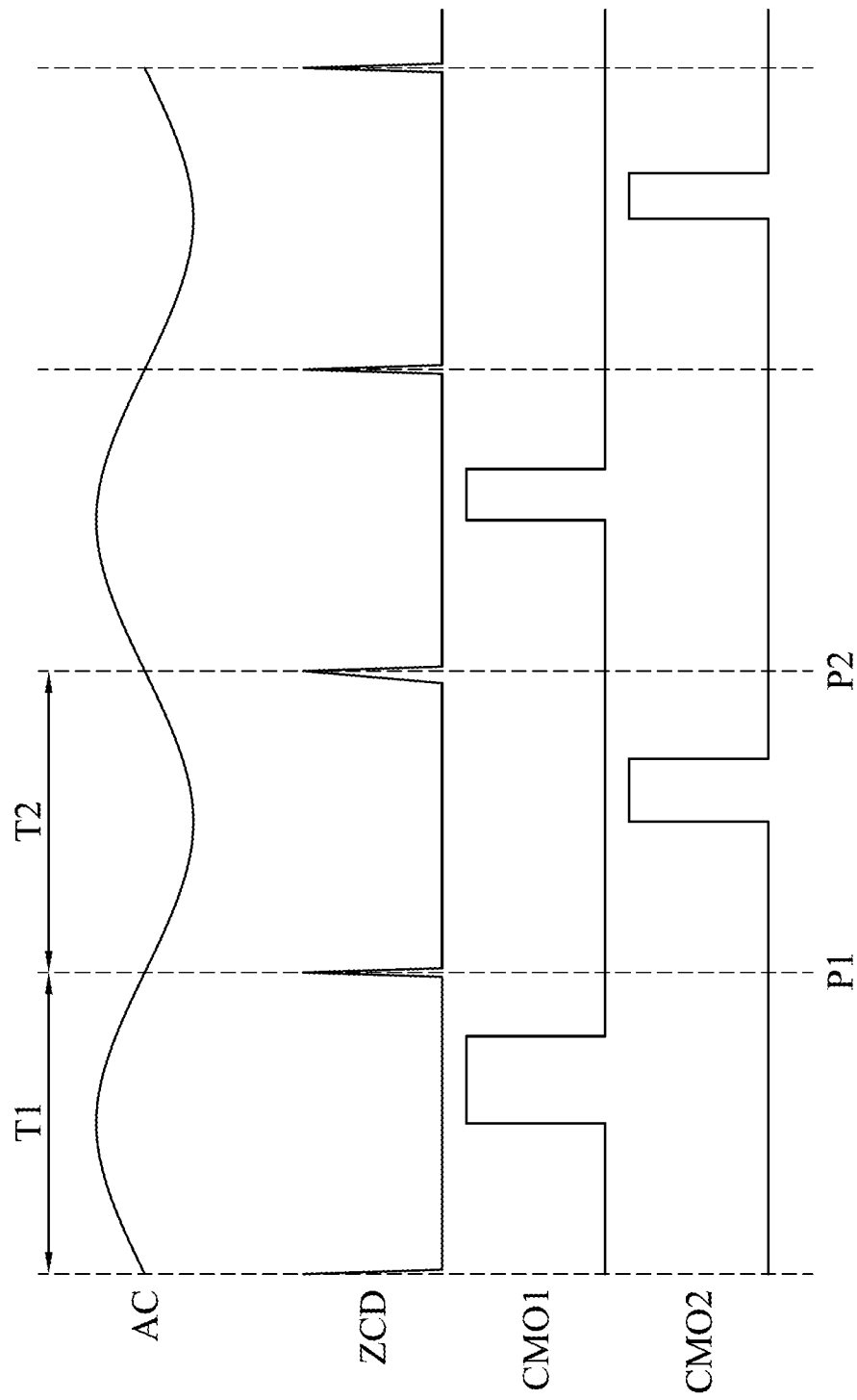
FIG. 7 is a schematic diagram illustrating detected signals of a capacitive load in accordance with some embodiments of the disclosure.

On another hand, the current flowing through the inductive load will be 90 degrees after the voltage; therefore, if the transition time of the voltage signal CMO1 or CMO2 is before the time of the zero-voltage pulse signal ZCD having the peak value, the load 140 is identified as the capacitive load. For example, please refer to FIG. 7, a schematic diagram illustrating a detected signal of the capacitive load in accordance with some embodiments of the disclosure. As shown in FIG. 7, at the time P1 of the AC input signal AC turning from positive to negative, the zero-voltage pulse signal ZCD has the peak value and before the time P1, the voltage signal CMO1 turns from the high level into the low level. When the AC input signal AC is at the negative half cycle in the period T2, the current flows through the load 140 along the second direction. At the time P2 of the AC input signal AC turning from negative to positive, the zero-voltage pulse signal ZCD has the peak value and before the time P2, the voltage signal CMO2 turns from the high level into the low level.

Therefore, if the zero-voltage pulse signal ZCD has the peak value at a first time (e.g., the time P1) of the zero-voltage pulse signal ZCD turning from positive to negative, and if the voltage signal CMO1 turns from the high level into the low level before the first time, the control circuit 190 can identify the load 140 as the capacitive load. Or if the zero-voltage pulse signal ZCD has the peak value at the second time (e.g., the time P2) of the zero-voltage pulse signal ZCD turning from negative to positive, and if the voltage signal CMO2 turns from the high level into the low level before the second time, the control circuit 190 can identify the load 140 as the capacitive load.

In this way, by the control circuit 190 comparing the time of the received zero-voltage pulse signal ZCD with the high level and the time of the transition of the voltage signals CMO1 and CMO2, according to that the latter compared to the former is synchronous, behind, or leading, the connected load 140 is able to be determined as resistance, inductive, or capacitive. In addition, by identifying the type of load 140 through the load identification system 100, users or other connected systems can perform different control or protective operations for different characteristics of each type of the load so that the compatibility of system with different components can be improved and more application functions can be added to the system.

It should be noted that the sequence of execution of the processes in the foregoing flowcharts is merely an exemplary embodiment, not intended to limit to the present disclosure. Various alterations and modifications may be performed on the disclosure by those of ordinary skills in the art without departing from the principle and spirit of the disclosure. In the foregoing, exemplary operations are included. However, these operations do not need to be performed sequentially. The operations mentioned in the embodiment may be adjusted according to actual needs unless the order is specifically stated, and may even be performed simultaneously or partially simultaneously.

It is noted that, the drawings, the embodiments, and the features and circuits in the various embodiments may be combined with each other as long as no contradiction appears. The circuits illustrated in the drawings are merely examples and simplified for the simplicity and the ease of understanding, but not meant to limit the present disclosure. In addition, those skilled in the art can understand that in various embodiments, circuit units may be implemented by different types of analog or digital circuits or by different chips having integrated circuits. Components may also be integrated in a single chip having integrated circuits. The description above is merely by examples and not meant to limit the present disclosure.

In summary, in various embodiments of the present disclosure, the zero-voltage pulse signal ZCD output by the zero-crossing detection circuit 120 can obtain the time when the AC input signal output by the AC power input component 110 passes through the zero potential. With the voltage signals CMO1 and CMO2 output by the current phase detection circuit 130, the direction of the current flowing through the load 140 can be determined. And by comparing the time of the zero-voltage pulse signal ZCD with peak value, and the transition time of voltage signals CMO1 and CMO2, the connected load 140 can be identified as resistive, inductive or capacitive according to whether the latter compared to the former is synchronous, behind or leading.

Although specific embodiments of the disclosure have been disclosed with reference to the above embodiments, these embodiments are not intended to limit the disclosure. Various alterations and modifications may be performed on the disclosure by those of ordinary skills in the art without departing from the principle and spirit of the disclosure. Thus, the protective scope of the disclosure shall be defined by the appended claims.

What is claimed is:

1. A load identification system, comprising:
   an AC power input component;
   a load, coupled to the AC power input component;
   a zero-crossing detection circuit, coupled to the AC power input component, configured to output a zero-voltage pulse signal when a zero-crossing signal of the AC power input component is detected;
   a first current phase detection circuit, coupled to the AC power input component, configured to detect a current flowing through the load to output a first voltage signal, wherein the first voltage signal is at a high level when the current flows along a first direction;
   a second current phase detection circuit, coupled to the AC power input component, configured to detect the current flowing through the load to output a second voltage signal, the second voltage signal is at the high level when the current flows along a second direction; and
   a control circuit, configured to receive the zero-voltage pulse signal, the first voltage signal and the second voltage signal and to identify a type of the load according to the zero-voltage pulse signal, the first voltage signal and the second voltage signal;
   wherein the first current phase detection circuit comprises a first comparator and a first resistance, the second current phase detection circuit comprises a second comparator and a second resistance, the first resistance, the second resistance and the load are connected in series.

2. The load identification system of claim 1, wherein if the zero-voltage pulse signal has a peak value at a first time, and the first voltage signal or the second voltage signal turns from the high level to a low level at the first time, the control circuit identifies the load as a resistive load.

3. The load identification system of claim 1, wherein if the zero-voltage pulse signal has a peak value at a first time, and the first voltage signal or the second voltage signal turns from the high level to a low level after the first time, the control circuit identifies the load as an inductive load.

4. The load identification system of claim 1, wherein if the zero-voltage pulse signal has a peak value at a first time, and the first voltage signal or the second voltage signal turns from the high level to a low level before the first time, the control circuit identifies the load as a capacitive load.

5. The load identification system of claim 1, wherein the zero-crossing detection circuit comprises an optical coupler.

6. The load identification system of claim 1, wherein when the current is flowing through the first resistance along the first direction, if the zero-voltage pulse signal has a peak value while the first voltage signal is turning from the high level to a low level, the control circuit identifies the load as a resistive load.

7. The load identification system of claim 1, wherein when the current flowing through the second resistance along the second direction, if the zero-voltage pulse signal has a peak value while the first voltage signal is turning from the high level to a low level, the control circuit identifies the load as a resistive load.

8. The load identification system of claim 1, wherein when the current flowing through the first resistance along the first direction, if the zero-voltage pulse signal has a peak value before the first voltage signal is turning from the high level to a low level, the control circuit identifies the load as an inductive load.

9. The load identification system of claim 1, wherein when the current flowing through the second resistance along the second direction, if the zero-voltage pulse signal has a peak value before the first voltage signal is turning from the high level to a low level, the control circuit identifies the load as an inductive load.

10. The load identification system of claim 1, wherein when the current flowing through the first resistance along the first direction, if the zero-voltage pulse signal has a peak value after the first voltage signal is turning from the high level to a low level, the control circuit identifies the load as a capacitive load.

11. The load identification system of claim 1, wherein when the current flowing through the second resistance along the second direction, if the zero-voltage pulse signal has a peak value after the first voltage signal is turning from the high level to a low level, the control circuit identifies the load as a capacitive load.

12. The load identification system of claim 1, wherein a first input terminal of the first comparator is configured to receive the current, a second input terminal of the first comparator is configured to receive a system low voltage, a first input terminal of the second comparator is configured to receive the current, a second input terminal of the second comparator is configured to receive the system low voltage.

13. The load identification system of claim 1, wherein a first input terminal of the first comparator is coupled to a first terminal of the first resistance, a second terminal of the first resistance and a first terminal of the second resistance are coupled to ground, a first input terminal of the second comparator is coupled to a second terminal of the second resistance.

14. The load identification system of claim 1, wherein when the current flowing through the first resistance has the first direction, the first voltage signal is at the high level, the second voltage signal is at a low level.

15. The load identification system of claim 1, wherein when the current flowing through the second resistance has the second direction, the second voltage signal is at the high level, the first voltage signal is at a low level.

* * * * *